(12) United States Patent
Schipfer

(10) Patent No.: US 10,539,624 B2
(45) Date of Patent: Jan. 21, 2020

(54) ENERGY ACCUMULATOR EMULATOR AND METHOD FOR EMULATION OF AN ENERGY ACCUMULATOR EMULATOR

(71) Applicant: AVL LIST GMBH, Graz (AT)

(72) Inventor: Gottfried Schipfer, Wettmannstätten (AT)

(73) Assignee: AVL LIST GmbH, Graz (AT)

( * ) Notice: Subject to any disclaimer, the term of this patent is extended or adjusted under 35 U.S.C. 154(b) by 599 days.

(21) Appl. No.: 15/125,440

(22) PCT Filed: Mar. 10, 2015

(86) PCT No.: PCT/EP2015/054927
§ 371 (c)(1),
(2) Date: Sep. 12, 2016

(87) PCT Pub. No.: WO2015/135922
PCT Pub. Date: Sep. 17, 2015

(65) Prior Publication Data
US 2018/0017630 A1    Jan. 18, 2018

(30) Foreign Application Priority Data

Mar. 14, 2014    (AT) .............................. A 50187/2014

(51) Int. Cl.
*G06F 17/50*    (2006.01)
*G06F 9/445*    (2018.01)
(Continued)

(52) U.S. Cl.
CPC ......... *G01R 31/367* (2019.01); *G01R 31/396* (2019.01); *G06F 17/5036* (2013.01); *G01M 15/02* (2013.01); *G05B 17/02* (2013.01)

(58) Field of Classification Search
CPC .. G01R 31/367; G06F 17/5036; G01M 15/02; G05B 17/02
(Continued)

(56) References Cited

U.S. PATENT DOCUMENTS 8,299,767 B1 * 10/2012 Tuozzolo ........... H03K 17/0822
                                                    323/275
8,791,710 B2     7/2014 Bracker et al.
(Continued)

FOREIGN PATENT DOCUMENTS

AT           510998       8/2012
CN         102654565      9/2012
(Continued)

OTHER PUBLICATIONS

English Abstract of AT 510998.
(Continued)

*Primary Examiner* — Thai Q Phan
(74) *Attorney, Agent, or Firm* — Dykema Gossett PLLC

(57) ABSTRACT

According to the invention, in an energy accumulator emulation the accuracy of energy accumulator emulation is increased in that a load current demand on the energy accumulator (20) is converted to a cell tester load current ($I_Z$) of a real reference cell (6) based on the configuration of the energy accumulator (20) and the cell tester load current ($I_Z$) is applied to the reference cell (6), and thereby the cell voltage ($U_Z$) of the reference cell (6) is measured and the cell voltage ($U_Z$) of the reference cell (6) is converted to a first energy accumulator voltage ($U_B$) based on the configuration of the energy accumulator (20), a second energy accumulator voltage ($U_{B\_Mod}$) is calculated from the energy accumulator model (10) and the load current demand and the first energy accumulator voltage ($U_B$) is compared to the second energy accumulator voltage ($U_{B\_Mod}$) and the energy accu-
(Continued)

Figure 1:
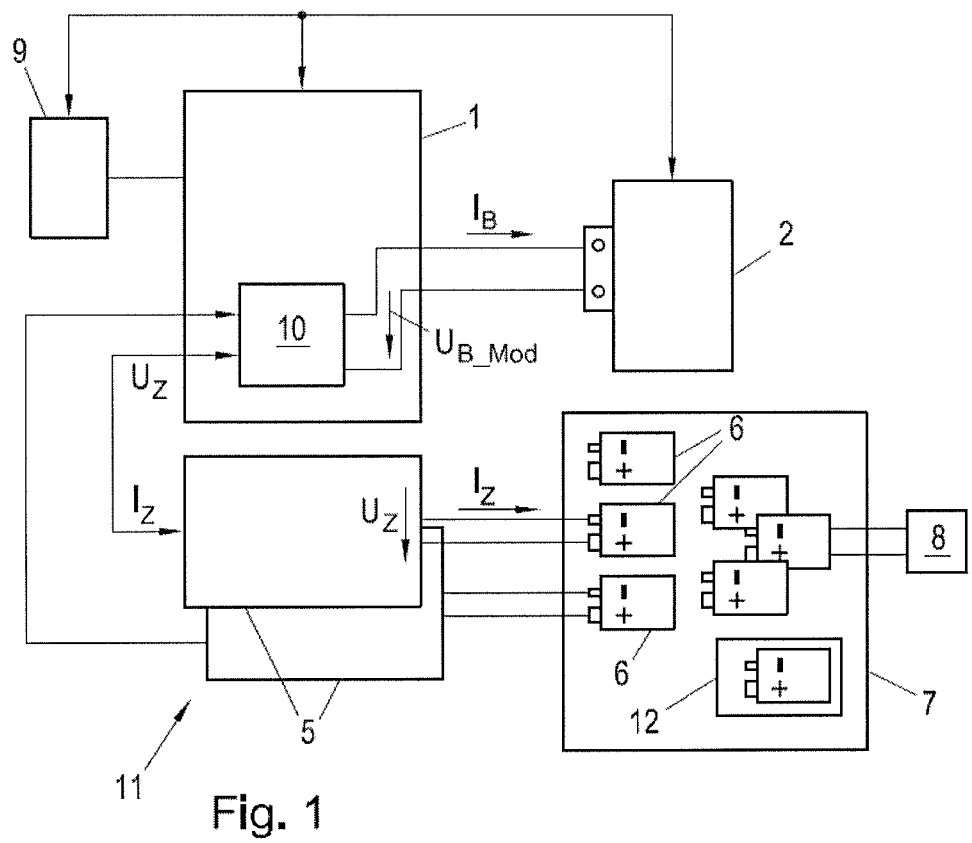

mulator model (10) is adjusted if the first energy accumulator voltage ($U_B$) deviates by a specified tolerance range (TB) from the second energy accumulator voltage ($U_{B\_Mod}$).

8 Claims, 2 Drawing Sheets

(51) Int. Cl.
    *G01R 31/367*     (2019.01)
    *G01R 31/396*     (2019.01)
    *G01M 15/02*     (2006.01)
    *G05B 17/02*     (2006.01)

(58) Field of Classification Search
    USPC .................................................. 703/2, 18, 19
    See application file for complete search history.

(56) References Cited

U.S. PATENT DOCUMENTS

| | | |
|---|---|---|
| 2012/0150503 A1 | 6/2012 | Haupt et al. |
| 2012/0239340 A1 | 9/2012 | Chen et al. |
| 2013/0207462 A1* | 8/2013 | Boehm ............... H01M 10/482 307/10.1 |
| 2014/0067344 A1* | 3/2014 | Kawai ................. G06F 17/5036 703/2 |
| 2015/0143885 A1* | 5/2015 | Konig ................... G01M 15/02 73/115.01 |
| 2015/0293179 A1 | 10/2015 | Schipfer et al. |
| 2016/0188769 A1* | 6/2016 | Aylott ................ G06Q 10/0633 703/6 |
| 2017/0160708 A1* | 6/2017 | Bracker ................. G05B 17/02 |

FOREIGN PATENT DOCUMENTS

| | | |
|---|---|---|
| JP | 2012047715 | 3/2012 |
| WO | 2006054066 | 5/2006 |

OTHER PUBLICATIONS

English Abstract of JP 2012047715.
English Abstract of CN 102654565.
English Abstract of CN 2664000.
English Abstract of CN 1773806.
English Abstract of CN 201408117.
English Abstract of CN 102411310.
English Abstract of JP 2012048921.

* cited by examiner

ENERGY ACCUMULATOR EMULATOR AND METHOD FOR EMULATION OF AN ENERGY ACCUMULATOR EMULATOR

The present invention relates to an energy accumulator emulator with an energy accumulator model for emulation of an electrical energy accumulator consisting of a plurality from cells and having at least one real reference cell which is connected by means of a cell tester to the energy accumulator emulator, and the invention also relates to a method for emulation of an energy accumulator.

In the development of electrical energy accumulators, in particular traction batteries or battery packs for hybrid or electric vehicles, energy accumulator emulators which mimic the real behavior of an energy accumulator play an important role. Such energy accumulators are very expensive, and therefore it is advantageous to emulate the energy accumulator and to carry out the development work or tests on the emulation. In this case an energy accumulator emulator comprises an energy accumulator model which, based on a performance requirement, for example a required current, sets the output voltage which would be set in the real battery. Depending upon the complexity of the energy accumulator model, various influencing factors can be taken into consideration, such as, for example, load, temperature, state of charge (SoC), battery chemistry, etc. Such an energy accumulator emulator is disclosed, for example, by AT 510 998 A2.

Different energy accumulator models can be provided for each energy accumulator, depending upon the required precision. In addition, there are also various battery types, such as for example Li-ion or LiFePO4 batteries, which likewise require different energy accumulator models. Furthermore, an energy accumulator can be modelled at the cell, module (unit consisting of a plurality of cells) or pack (unit consisting of a plurality of modules) level. And last but not least, each energy accumulator model can also be parameterized differently. In practice, therefore, the cost of energy accumulator modelling and the parameterization of an energy accumulator model is very high. Apart from this, as a rule an energy accumulator model does not supply output variables of the same good quality over the entire operating range of the battery. Therefore, in some circumstances it is also necessary for the energy accumulator model to be recalibrated or changed before or even during an emulation, in order to adapt it to a specific operating range. During calibration the model parameters of the energy accumulator model are usually adjusted. However, the time at which the energy accumulator model should be recalibrated or changed is only difficult to determine in advance because the quality of the energy accumulator model is also affected by other influencing factors, such as, for example, SoC, temperature.

In JP 2012-047715 A, an energy accumulator emulator is described, in which a real reference cell, or a real reference cell group, is used in order to detect the voltage behavior of the real cell. The voltage behavior of the individual cell is then extrapolated for the plurality of cells of a real battery, in order to determine the voltage behavior of the complete battery. This battery voltage is generated by a voltage source and connected to an electrical load. Thus a complete battery can be emulated with the aid of an individual real reference cell. However, the emulated battery always consists of identical cells, which in reality is not normally the case. Different cell states cannot be emulated in this way, which restricts the possibilities for emulation.

Therefore, it is an object of the present invention in an energy accumulator emulation, on the one hand, to increase the precision of the energy accumulator emulation and, on the other hand, to eliminate the problems with energy accumulator models described above and thereby nevertheless to remain flexible in the possibilities for emulation of an energy accumulator.

This object is achieved according to the invention in that in an energy accumulator emulation the accuracy of energy accumulator emulation is increased in that a load current demand on the energy accumulator is converted to a cell tester load current of a real reference cell based on the configuration of the energy accumulator and the cell tester load current is applied to the real reference cell, and thereby the cell voltage of the reference cell is measured and the cell voltage of the reference cell is converted to a first energy accumulator voltage based on the configuration of the energy accumulator, a second energy accumulator voltage is calculated from the energy accumulator model and the load current demand and the first energy accumulator voltage is compared to the second energy accumulator voltage and the energy accumulator model is adjusted if the first energy accumulator voltage deviates by a specified tolerance range from the second energy accumulator voltage. This makes it possible to adapt the energy accumulator model as required and thus to ensure sufficient precision over the entire operating range of the energy accumulator. Since in this case the most varied energy accumulator models can be used, the method remains sufficiently flexible in order to be able to carry out the most varied energy accumulator emulations. Moreover, in this way it is ensured that the time at which the energy accumulator model is adjusted is correct, i.e. whenever the error between model and reality becomes too great. Thus the precision of the energy accumulator emulation can be influenced directly. In particular, by means of a plurality of reference cells, for example with different SoC and/or temperature states, the energy accumulator model can also be calibrated or readjusted, or actually determined, before and even during a test run.

The energy accumulator model can be adapted very simply if a model parameter of the energy accumulator is newly calculated from a measured value of the reference cell. Since in any case during the energy accumulator emulation measured values are captured on a reference cell, these can advantageously be used for the adaptation.

If the energy accumulator model exists as an electrical model, the adaptation can take place very simply, in that a measured value of the reference cell, for example the open circuit voltage, is extrapolated to a model parameter of the energy accumulator model on the basis of the configuration of the energy accumulator. In this case the procedure may advantageously be such that the open circuit voltage of the reference cell is measured and is extrapolated to the open circuit voltage of the energy accumulator as model parameter on the basis of the configuration of the energy accumulator, the cell tester load current is extrapolated to the energy accumulator on the basis of the configuration of the energy accumulator and an internal resistance of the energy accumulator is calculated as model parameter by means of the energy accumulator voltage by using the relationship $$R_0 = \frac{(U_{OCB} - U_B)}{I_{ZB}}.$$

If the energy accumulator model is present as a mathematical model this can be simply adapted by calculation of a new model parameter of the energy accumulator model by using a mathematical optimization. Such mathematical models and optimization method are sufficiently known and can be implemented simply.

A further advantageous type of adaptation is provided by loading a different energy accumulator model. Thus for different operating ranges of the energy accumulator it is possible to use different energy accumulator models which best reflect the particular range. It may also be provided here that the ranges are specified in advance and different energy accumulator models are assigned in advance to the ranges, which simplifies the adaptation.

Likewise, it may advantageously be provided that the comparison of the first energy accumulator voltage with the second energy accumulator voltage and adaptation of the energy accumulator model as a function thereof is carried out when a predetermined operating point of the energy accumulator is reached. Thus, in addition, checking of the precision of the energy accumulator model can be enforced and the energy accumulator model can be adapted before the deviation between model and reality becomes too great, which can increase the precision of the energy accumulator emulation.

Figure 2:
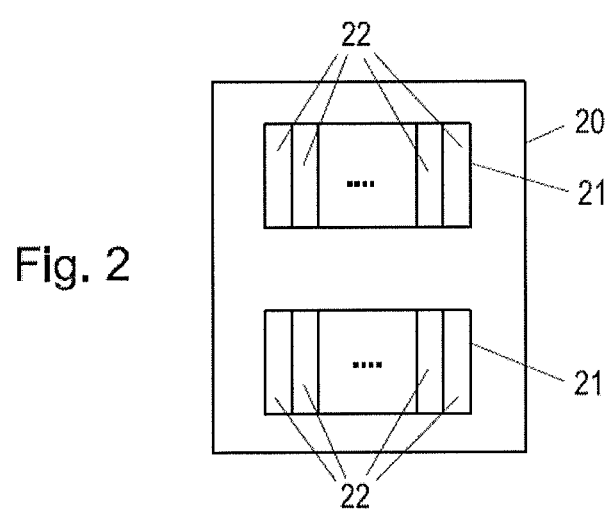
Figure 3:
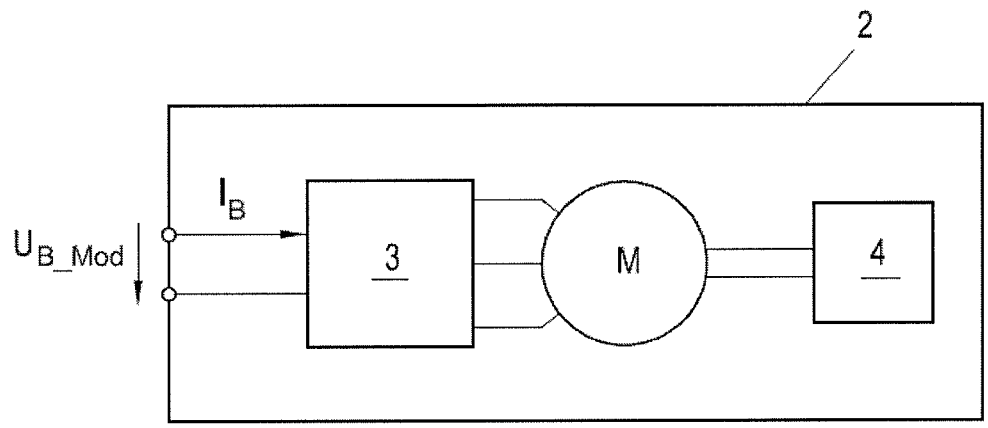
Figure 4:
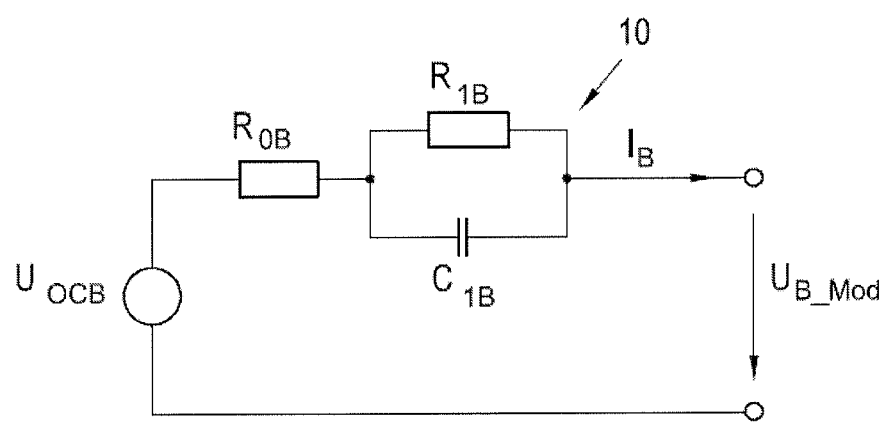

The present invention is explained in greater detail below with reference to FIGS. 1 to 4, which show by way of example, schematically and without limitation, advantageous embodiments of the invention. In the drawings:

FIG. 1 shows a schematic representation of a test bench arrangement with energy accumulator emulation according to the invention, FIG. 2 shows a schematic representation of a typical configuration of an energy accumulator, FIG. 3 shows an example of a testpiece which is supplied with electrical power by the energy accumulator emulator, and FIG. 4 shows a simple electrical energy accumulator model.

FIG. 1 shows a test bench arrangement 11 for an electrical drive train, for example of an electric or hybrid vehicle, as a testpiece 2, wherein the real electrical energy accumulator 20 for electrical supply to the testpiece 2 is emulated by means of an energy accumulator emulator 1. Such test bench arrangements 11 are used, for example, in the development of electrical energy accumulators or electrical drive trains.

An electrical energy accumulator 20, such as is illustrated schematically in FIG. 2, may be for example a battery, a fuel cell, a SuperCap or the like. A cell 22 is the smallest electrical unit of an electrical energy accumulator 20. A module 21 consists of a number of cells 22 and an energy accumulator 20 can have a number of modules 21 and/or cells 22. In this case the cells 22 and modules 21 can be connected to one another in series or in parallel as required. In this case the configuration of an electrical energy accumulator 20 is also frequently specified in the xSyP type, wherein x represents the number of serial cells 21 and y represents the number of parallel modules 21. Thus the designation 100S2P designates an energy accumulator consisting of two parallel modules 21, which in turn each consists of a hundred cells 22 connected in series.

In FIG. 3 an electrical drive train, with an electric motor M, which is supplied by a current converter 3 and drives a load 4, is illustrated by way of example as testpiece 2. A regulated load machine (for example in the form of an electric motor, a so-called dynamometer) may also be considered as a load 4, in order to be able to predetermine different load states. Of course, any other configurations are conceivable as testpiece 2. In real operation the testpiece 2 specifies a load current demand, or equally a performance requirement, on the energy accumulator 20 (in this case, for example, a battery), for example by a predetermined driving profile to be followed for the drive train, said demand causing a load current $I_B$ which leads to an energy accumulator voltage $U_B$. This behavior of a real energy accumulator 20 should be simulated as accurately as possible by the energy accumulator emulator 1 with the aid of an energy accumulator model 10.

For emulation of the electrical energy storage device 20, in the exemplary embodiment according to FIG. 1, in the energy accumulator emulator 1 an energy accumulator model 10 is implemented which in a known manner determines from a load current $I_B$ the voltage of the energy accumulator $U_{B\_Mod}$ which is applied to the output of the energy accumulator emulator 1. Such energy accumulator models 10 are well known and include a number of parameters which describe the behavior of the energy accumulator. A simple electrical energy accumulator model 10 for a battery, as shown in FIG. 4, consists of a series connection of a voltage source $U_{OCB}$ for the open circuit voltage, an RC circuit consisting of a parallel resistor $R_{1B}$ and a capacitor $C_{1B}$ and a further resistor $R_{0B}$. In the simplest case the energy accumulator model 10 can also consist only of a series connection of a voltage source $U_{OCB}$ and of a resistor $R_{0B}$. Likewise it is conceivable that the energy accumulator model 10 also includes further RC circuits, consisting for example of a parallel-connected resistor $R_{2B}$ and capacitor $C_{2B}$. Such electrical energy accumulator models 10 are sufficiently known, and therefore are not discussed further here. Of course, more complex energy accumulator models 10 are also conceivable. In the calibration of the energy accumulator model 10 the model parameters, in this case for example the voltage $U_{OCB}$, resistors $R_{0B}$, $R_{1B}$ and capacitor $C_{1B}$, are provided with specific values. Usually in the form of characteristic fields, in which the model parameters are specified as a function of state variables of the energy accumulator, e.g. the temperature T and the SoC (state of charge), for example $U_{OC}=f(T, SoC)$, $R0=f(T, SoC)$. Likewise, the model parameters for charging and discharging with different values are stored, in order to represent the different charging and discharging behavior of an energy accumulator. In this case the calibration can take place by corresponding measurements on a cell 22 of the energy accumulator 20 or a modulus 21 of the energy accumulator 20. The energy accumulator model 10 can also have submodels for individual cells 22 or modules 21, in order to be able to represent different cell states in the energy accumulator 20.

Furthermore, in the test bench arrangement 11 at least one reference cell 6 is provided which is connected to a cell tester 5. A group of individual cells or modules connected in series and/or in parallel are also understood as a reference cell 6. Cell testers 5 are electrical circuits which are well known per se, are connected to a cell, a module or an energy accumulator and apply to the connected component a load current (charging, discharging) or likewise a performance requirement (charging, discharging), and in this case detect the cell voltage $U_Z$, in response to the applied load current. Such a cell tester 5 is disclosed, for example, by AT 511 890 A1. The cell tester 5 can also detect other parameters of the reference cell 6, such as, for example, temperature, SoC or SoH (state of health), or can calculate them in a known manner from other measurement variables.

The illustrated structure with cell tester 5 and reference cells 6 does not have to be connected fixedly to the energy accumulator emulator 1, but can also be used movably and also only if required.

The reference cell 6 is used here in order to determine the deviation of the energy accumulator model 10 from a real reference cell 6. For this purpose, first of all the detected cell voltage $U_Z$ is converted, for example, as described below, to an energy accumulator voltage $U_B$. The energy accumulator model 10 emulates, for example, an electrical energy accumulator 20 of the 100S2P type consisting of LiFePO4 (lithium iron phosphate) cells with 20 Ah and 3.3 VDC rated current and rated voltage, that is to say 40 Ah and 330 VDC for the energy accumulator 20. If in the test run, for example through the test bench automation system 9, a load current $I_B$ of 80A is predetermined, for example in order to accelerate the electric motor M, in the energy accumulator emulator 1 this requirement from the energy accumulator configuration, for example 100S2P, is scaled down to a cell tester load current $I_Z$ of an individual electrical unit of the energy accumulator 20, for example a cell 21 or a modulus 22 or a combination thereof, and the reference cell 6 connected to the cell tester 5 is loaded with this cell tester load current $I_Z$. In the stated configuration of the energy accumulator 20 a load current of 80 A would therefore be scaled down to a cell tester load current $I_Z$=40 A for a cell 22 or a module 21 of the energy accumulator 20. In this case the configuration of the reference cell 6 (consisting of cells and modules) corresponds to the configuration of the electrical unit to which the scaling down is performed. In the simplest case scaling down to an individual cell 22 of the energy accumulator 20 is performed and the reference cell 6 is an individual real cell 22 of the energy accumulator 20. Instead of the load current $I_B$ a power P could likewise also be predetermined. The reaction of the reference cell 6 in the form of the cell voltage $U_Z$, e.g. 3.15 VDC, is detected by the cell tester 5 and supplied to the energy accumulator emulator 1. The energy accumulator emulator 1 converts the obtained cell voltage $U_Z$ with reference to the energy accumulator configuration, for example 100S2P, into an energy accumulator voltage $U_B$, in this case for example 315 VDC.

In this context other parameters of the energy accumulator 20, such as SoC or SoH, can also be determined in a manner which is known per se, for example by the cell tester 5 or by the energy accumulator emulator 1. The of course also functions for the case of charging of the electrical energy accumulator 20, for example by recuperation. In this case as a function of the load current $I_B$ the reference cell 6 is charged by the cell tester 5 with a cell tester load current $I_Z$. Thus the real reference cell 6 is a mirror image of the state and the reaction of a real energy accumulator 20.

Of course, it is also conceivable to supply the energy accumulator model 10 from various reference cells 6 or cell testers 5, as indicated in FIG. 1, in order, for example, to emulate energy accumulators 20 with defective or unbalanced cells. In this case the energy accumulator model 10 can also consist, for example, of a plurality of (sub)models, for example as illustrated in FIG. 4.

The energy accumulator voltage $U_B$ determined in this way is now compared with the energy accumulator voltage $U_{B\_Mod}$ calculated by the energy accumulator model 10 from the same performance requirement. If the calculated energy accumulator voltage $U_{B\_Mod}$ is within a predetermined tolerance range TB around the determined energy accumulator voltage $U_B$, and thus $|U_{B\_Mod} - U_B| < TB$ applies, the calculated energy accumulator voltage $U_{B\_Mod}$ is generated by the energy accumulator emulator 1 and connected to the testpiece 2.

If the calculated energy accumulator voltage $U_{B\_Mod}$ is outside the tolerance range, the energy accumulator model 10 in the energy accumulator emulator 1 is adapted, in order to maintain the quality of the emulation. The adaptation takes place, for example, in such a way that from current measured values of the reference cell 6, e.g. cell voltage $U_Z$, temperature, etc., at least one required model parameter, e.g. open circuit voltage $U_{OCB}$, resistors $R_{OB}$, $R_{1B}$ and capacitor $C_{1B}$, is calculated or the model parameter is measured on the reference cell 6 and extrapolated to the energy accumulator, in order to bring the calculated energy accumulator voltage $U_{B\_Mod}$ within the tolerance range TB. Depending upon the type of the energy accumulator model 10, the procedure may be different here.

In the case of a very simply electrical energy accumulator model 10 with a series connection of a voltage source of the open circuit voltage $U_{OCB}$ and a resistor $R_{OB}$ (the internal resistor of the energy accumulator) the procedure could, for example, be as follows. First of all, a suitable reference cell 6 of the energy accumulator is selected, which corresponds best to the current operating point. If the current operating point of the energy accumulator is, for example, 20% SoC at a temperature T of 25° C., then a reference cell 6 which likewise has this operating point is preferably used. If such a reference cell is not available, then a reference cell 6 which comes closest to this operating point is taken. Then on this reference cell 6 the cell tester 5 measures the open circuit voltage $U_{OC}$ of the reference cell 6, i.e. the output voltage of the unloaded reference cell 6, which is then extrapolated as described above to the open circuit voltage $U_{OCB}$ of the energy accumulator. Then the cell tester 5 applies the current cell tester load current $I_Z$ to the reference cell 6 and measures the reaction in the form of the output voltage $U_Z$ of the reference cell 6, which again is extrapolated to the energy accumulator voltage $U_B$ of the energy accumulator. The cell tester load current $I_Z$ is likewise extrapolated ($I_{ZB}$) to the energy accumulator. Then from this the internal resistance $R_0$ of the energy accumulator can be calculated from the relationship $$R_0 = \frac{(U_{OCB} - U_B)}{I_{ZB}}.$$

The model parameters of the energy accumulator model of the energy accumulator determined in this way, in this case the open circuit voltage $U_{OCB}$ and the internal resistance $R_{OB}$, are then updated in the underlying characteristic fields at the location of the current operating point, wherein the values at this support point (given by the operating point) are replaced by the newly determined values. If there is no corresponding support point in the characteristic field for the current operating point, then either a new support point for this current operating point can be applied, or it is interpolated onto the closest available support point.

If the energy accumulator model 10 is present in the form of a mathematical model, for example in the form of a function $U_B = f(I_B, T, SoC, \ldots)$, of a neural network, of a local model network (LMN) or of a multilayer perceptron (MLP), then the new model parameters of the mathematical model (for example in the form of coefficients of the model)

can result from a mathematical optimization, wherein the error between the two determined energy accumulator voltages is minimized.

Alternatively, or also additionally, another energy accumulator model 10 can also be charged, for example as a function of the current operating point, e.g. provided by SoC, SoH (state of health) or the temperature. For this purpose, various energy accumulator models 10 can be stored, for example, in the energy accumulator emulator 1 or in the test bench automation system 9, from which the best suited one, i.e. the one with the least error with regard to the output voltage $U_Z$ measured on the reference cell 6, is then selected. The newly selected energy accumulator model 10 can optionally also be correspondingly calibrated. Likewise, it is conceivable to specify various energy accumulator models 10 in advance for various operating point ranges.

In this case the adaptation preferably always takes place so that the error between the energy accumulator voltage $U_{B\_Mod}$ calculated from the energy accumulator model and the energy accumulator voltage $U_B$ determined with the aid of the measurement on the reference cell 6 is at least within the predetermined tolerance range TB, but is preferably minimized.

However, the checking of the accuracy of the energy accumulator model 10 can also take place at predetermined operating points, for example whenever the SoC passes through specific points, such as for example with SoC equal to 0, 10, 20, 30, 40, . . . , 80, 90, 100. For this purpose, exactly as many reference cells 6 with the corresponding SoC values are kept in stock, which are also tempered according to the emulated energy accumulator. If during the test run of one of the predetermined operating points (in this case in the form of the SoC values) is passed, the accuracy of the energy accumulator model 10 is checked as described above. In this case another tolerance range TB can also be predetermined. If the accuracy is outside the tolerance range TB, an adaptation of the energy accumulator model 10 again takes place as described above.

The adaptation of the energy accumulator model 10 can take place manually or preferably by an automated process by corresponding algorithms in the energy accumulator emulator 1. Depending upon the type of the energy accumulator model 10, for example an electrochemical, electrical or mathematical model, various model parameters can be adapted for this. In this way an existing energy accumulator model 10 can be simply parameterized or calibrated, or the model parameters are adjusted in a simple manner, for example in the event of ageing of the reference cell 6, without having to represent it directly in the structure of the energy accumulator model 10. As a result, simpler energy accumulator models 10 can also be in used the energy accumulator emulator 1.

A pool 7 of reference cells 6 is advantageously kept in stock, for example, reference cells of the most varied type or the most varied states (SoC, SoH, temperature). Naturally, the reference cells 6 can also be prepared or preconditioned by the cell tester 5 or by external charging devices 8, for example in that a reference cell 6 is warmed by various charging cycles. With the warming it is possible in particular to emulate more realistic temperature distributions than would be possible with an external tempering of the reference cell 6, for example in a climatic chamber 12. By selection of the correctly reference cell(s) 6 in each case (type, operating point) the required energy accumulator can be emulated in the simplest manner.

In this case a cell 6 of the energy accumulator connected to a cell tester 5 can also be arranged in a well-known climatic chamber 12, in order additionally to be able to simulate external environmental conditions, such as for example ambient temperature, humidity, etc.

The invention claimed is:

1. An energy accumulator emulator comprising:
   an energy accumulator model configured and arranged for emulation of an electrical energy accumulator, the electrical energy accumulator including
   a plurality of cells, and
   at least one real reference cell which is connected by means of a cell tester to the energy accumulator emulator;
   wherein the energy accumulator emulator is configured and arranged to convert an electrical load current demand on the electrical energy accumulator to a load current demand on the at least one reference cell on the basis of the configuration of the electrical energy accumulator, and to apply the load current demand to the at least one reference cell by means of the cell tester in the form of a cell tester load current, and the cell tester is configured and arranged to
   detect the cell voltage of the at least one reference cell in response to the cell tester load current, and
   supply it to the energy accumulator emulator; and
   wherein the energy accumulator emulator is further configured and arranged to
   convert the cell voltage of the reference cell into a first energy accumulator voltage on the basis of the configuration of the electrical energy accumulator, and
   calculates a second energy accumulator voltage from the load current demand on the basis of the energy accumulator model, and
   compares the first energy accumulator voltage and the second energy accumulator voltage, and
   adapts the energy accumulator model if the first energy accumulator voltage deviates by a predetermined tolerance range from the second energy accumulator voltage.

2. A method for energy accumulator emulation by which an electrical energy accumulator is emulated by means of an energy accumulator emulator and an energy accumulator model implemented therein, the method including the steps of
   converting a load current demand on the energy accumulator to a cell tester load current of a real reference cell based on the configuration of the energy accumulator;
   applying the cell tester load current to the real reference cell, and thereby the cell voltage of the reference cell is measured;
   converting the cell voltage of the reference cell to a first energy accumulator voltage based on the configuration of the energy accumulator;
   calculating a second energy accumulator voltage from the energy accumulator model and the load current demand;
   comparing the first energy accumulator voltage to the second energy accumulator voltage; and
   adjusting the energy accumulator model in response to the first energy accumulator voltage deviating by a specified tolerance range from the second energy accumulator voltage.

3. The method according to claim 2, wherein the energy accumulator model is adapted, in that a model parameter of the energy accumulator is newly calculated from a measured value of the reference cell.

4. The method according to claim 2, wherein the energy accumulator model is present as an electrical model and is adapted in that a measured value of the reference cell is extrapolated to a model parameter of the energy accumulator model on the basis of the configuration of the energy accumulator.

5. The method according to claim 4, wherein the open circuit voltage of the reference cell is measured and is extrapolated to the open circuit voltage of the energy accumulator as model parameter on the basis of the configuration of the energy accumulator, the cell tester load current is extrapolated to the energy accumulator on the basis of the configuration of the energy accumulator and an internal resistance of the energy accumulator is calculated as a model parameter by means of the energy accumulator voltage ($U_B$) by using the relationship $$R_0 = \frac{(U_{OCB} - U_B)}{I_{ZB}}.$$

6. The method according to claim 2, wherein the energy accumulator model is present as a mathematical model and is adapted by calculation of a new model parameter of the energy accumulator model by using a mathematical optimization.

7. The method according to claim 2, wherein the energy accumulator model is adapted, in that another energy accumulator model is charged.

8. The method according to claim 7, wherein the comparison of the first energy accumulator voltage with the second energy accumulator voltage and adaptation of the energy accumulator model as a function thereof is carried out if a predetermined operating point of the energy accumulator is reached.

* * * * *